United States Patent [19]
Redman

[11] 3,975,698
[45] Aug. 17, 1976

[54] FIBER ACOUSTIC WAVEGUIDE AND SYSTEM

[75] Inventor: Charles M. Redman, Las Cruces, N. Mex.

[73] Assignee: The United States of America as represented by the Secretary of the Army, Washington, D.C.

[22] Filed: Dec. 15, 1975

[21] Appl. No.: 640,353

Related U.S. Application Data

[63] Continuation-in-part of Ser. No. 495,745, Aug. 8, 1974, abandoned.

[52] U.S. Cl............................... 333/30 R; 310/8.1; 333/72
[51] Int. Cl.² ...................... H03H 9/30; H03H 9/26; H03H 9/32
[58] Field of Search............... 333/29, 71, 30 R, 72, 333/30 M; 310/8, 8.1, 8.3–8.6, 9.5, 9.6, 9.7, 9.8; 29/35.5

[56] References Cited
UNITED STATES PATENTS

| | | |
|---|---|---|
| 3,736,532 | 5/1973 | Armenakas .................... 333/30 R |
| 3,824,505 | 7/1974 | Borner ............................ 333/30 R |

Primary Examiner—Alfred E. Smith
Assistant Examiner—Marvin Nussbaum
Attorney, Agent, or Firm—Nathan Edelberg; Robert P. Gibson; Saul Elbaum

[57] ABSTRACT

A fiber acoustic waveguide comprising a single crystal fiber and a single crystal film deposited on the outer elongated surface of the single crystal fiber, wherein the single crystal film has a higher velocity of propagation than the single crystal fiber. The fiber acoustic waveguide has a delay that is directly proportional to its length, whereupon fixed lengths of the waveguide provided fixed delay.

A fiber acoustic waveguide system is provided by connecting one end of the waveguide to driving transducer means for converting an electrical signal to an acoustic signal, and the other end of the waveguide to pickup transducing means for converting the transported acoustic signal from the waveguide back into an electrical signal.

22 Claims, 4 Drawing Figures

FIBER ACOUSTIC WAVEGUIDE SYSTEM

SINGLE CRYSTAL FIBER

TRANSDUCER (DRIVE)

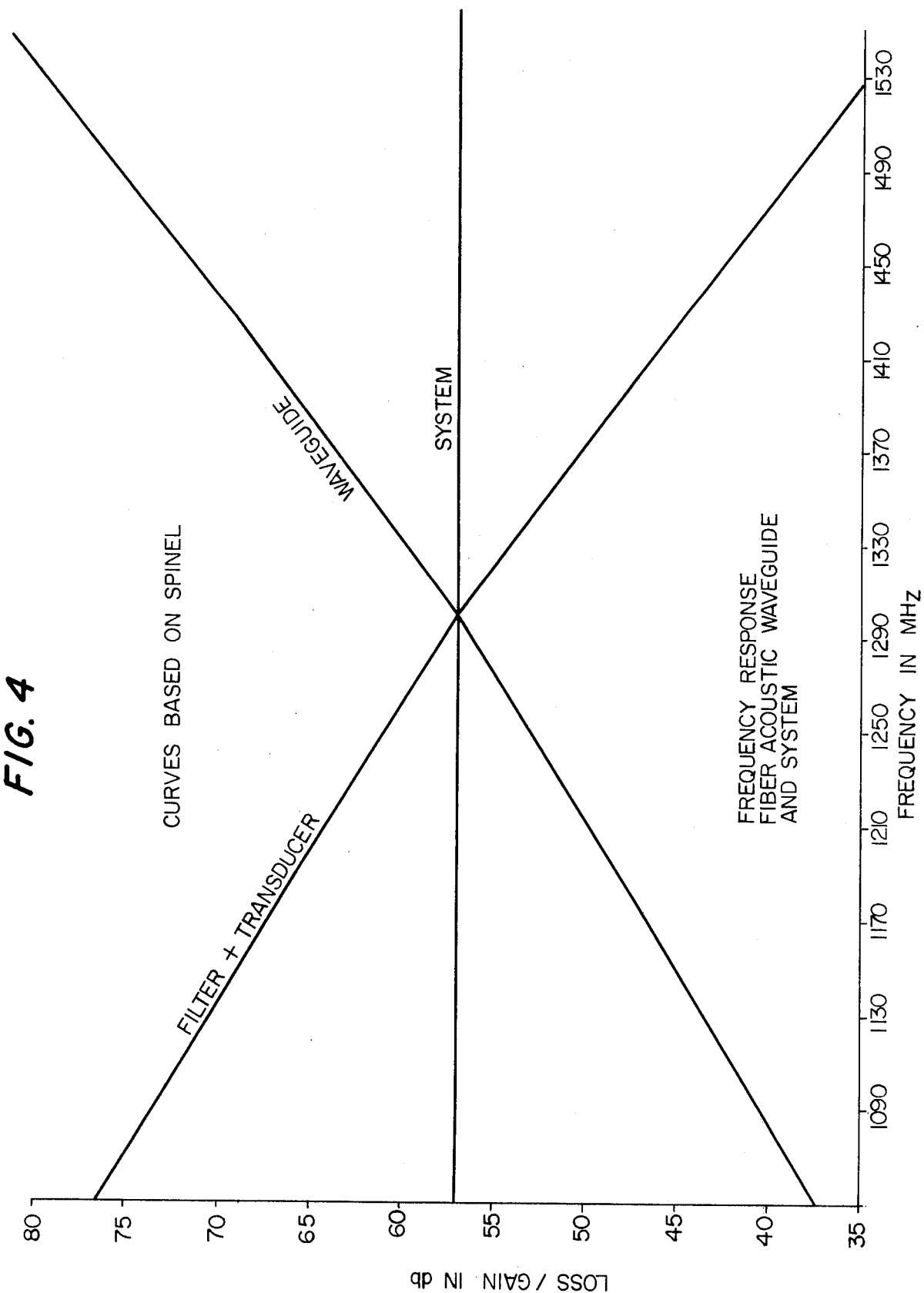

FIBER ACOUSTIC WAVEGUIDE AND SYSTEM

This application is a continuation-in-part of my copending U.S. Patent application, Ser. No. 495,745, filed Aug. 8, 1974 now abandoned.

BACKGROUND OF THE INVENTION

The field of the present invention relates generally to microsound (sound-wave analog of microwave) components and circuitry. More specifically, the present invention relates to a single crystal fiber acoustic waveguide, and its use in a single crystal fiber acoustic waveguide system.

Microwave techniques used in the manipulation of electromagnetic energy are now available, as a result of the development of microsound apparatus, for the manipulation of acoustic energy. Extensive research has been performed on guided acoustic wave devices utilizing acoustically slow epitaxial crystalline layers grown over faster wave single crystals.

A strip of slow wave single crystal material grown on a faster single crystal substrate allows the acoustic energy to be guided by or follow the strip, in a manner analogous to microwave energy following a dielectric microwave guide. Microsound guides are available with slow wave strips designed to guide acoustic energy around gradual bends. Coupling technique are available for interconnecting such guides, to transfer acoustic energy between them.

Through means of coupling such waveguides together and through appropriate design of the slow epitaxial grown layer, many devices including hybrides, filters, directional couplers, isolators, switches, grators, phase shifters and amplifiers can be provided. Such circuits are generally five orders of magnitude smaller in volume than analogous microwave circuits.

Presently, the maximum acoustic delay available from bulk crystals cut to substrate size is about 10 microseconds. Spiraling the slow waveguide has been used for relatively long delays; however, in such cases, as the simulation of radar range time, much longer delays are required. Recent advances in the art of growing crystal fibers now makes long length crystal acoustic delay lines feasible.

SUMMARY OF THE INVENTION

With the problems of the prior art in mind, it is a significant object of this invention to provide an improved acoustic waveguide.

Another object of this invention is to provide a single crystal fiber acoustic waveguide.

Yet another object of this invention is to provide an improved acoustic waveguide system.

Still a further object of this invention is to provide fiber acoustic delay lines.

These and other objects are provided by a single crystal fiber acoustic waveguide comprising a single crystal film deposited upon the outer surface of a single crystal fiber the crystal film material having a higher velocity of propagation than the crystal fiber material. The fiber acoustic waveguide is included in an acoustic waveguide system having a driving transducer for converting an electrical signal to an acoustic signal and coupling the acoustic signal into one end of the waveguide the other end of the waveguide is coupled to a pickup transducer which receives the acoustic signal, and converts it back into electrical signal. The delay of the waveguide is directly proportional to its length.

BRIEF DESCRIPTION OF THE DRAWINGS

The foregoing and other objects, features and advantages of the invention will be apparent from the following detailed description of the invention, as illustrated in the accompanying drawings, wherein like items are designated by the same numeral in which

FIG. 4 is the frequency response curves of a spinel fiber acoustic waveguide; a filter plus electroacoustic transducer; and the overall response of a fiber acoustic waveguide system including the waveguide, filter and transducer.

DETAILED DESCRIPTION OF THE INVENTION

Figure 1:
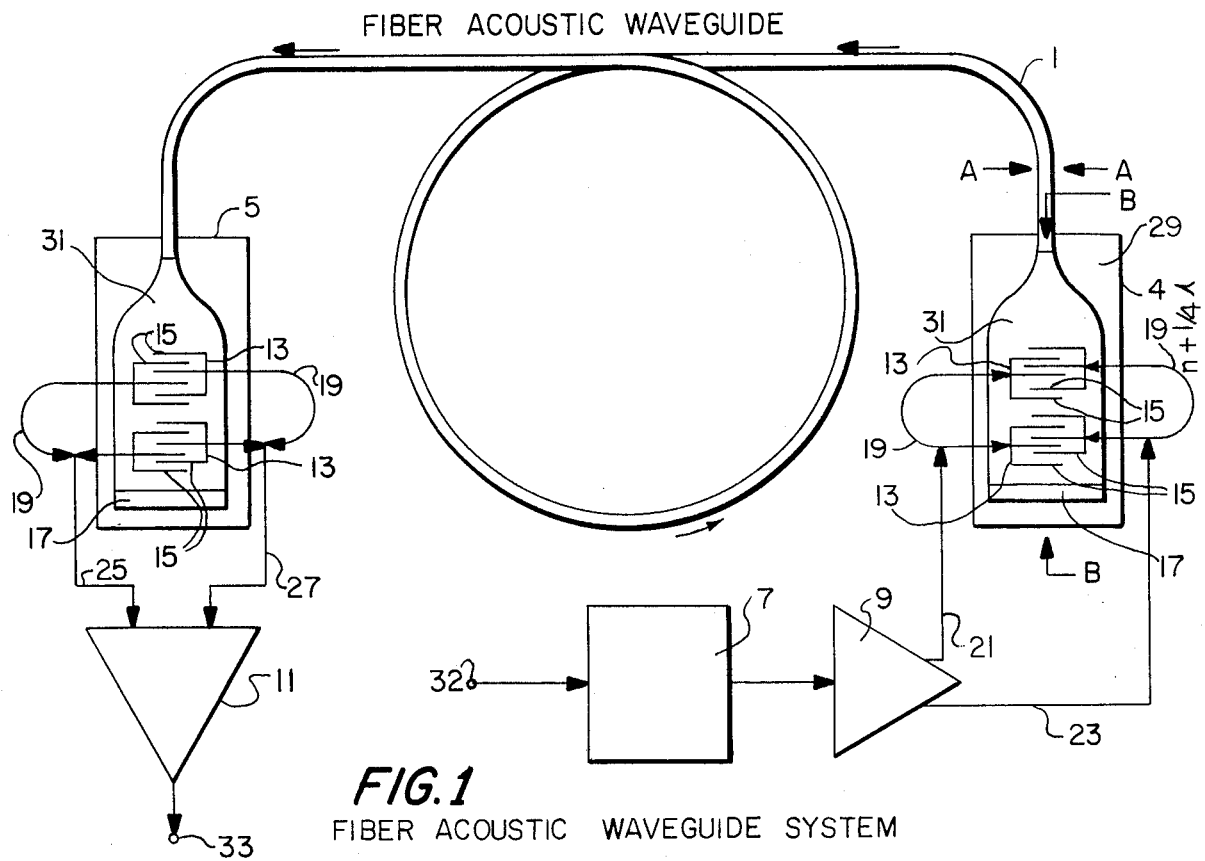
FIG. 1 is a fiber acoustic waveguide system.

A fiber acoustic waveguide 1 is shown in FIG. 1, interconnected within a fiber acoustic waveguide system. Cross-section AA of the fiber acoustic waveguide 1, as shown in FIG. 2 is given as an example of a typical cross-section single crystal fiber acoustic waveguide 1.

Figure 2:
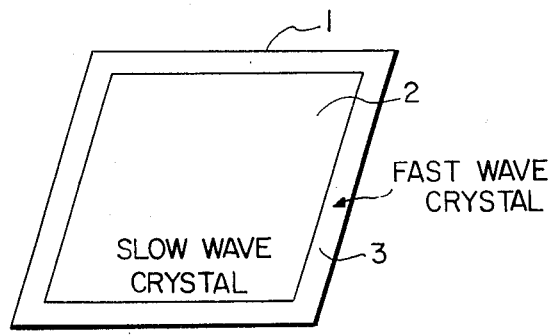
FIG. 2 is cross-section AA of one particular single crystal fiber acoustic waveguide.

With reference to FIG. 2, the single crystal fiber cross-section 2 of the waveguide 1 is shown to have a crystal face in the shape of a trapezohedron. The single crystal fiber 2 of the waveguide 1 may have a cross-sectional shape equivalent to any one of many different geometrical forms. The shape of the face of the single crystal fiber 2 is determined by the type of crystal material, the crystal axis growth is maintained on, and the growth technique used in producing the crystals, for example, may have dodecahedron (12 sides), trapezohedron(4 sides), hexoctahedron (48 equal triangular faces, cubic, or octahedral growth faces). The velocity of propagation and acoustic loss of a single crystal fiber waveguide 1 are dependent upon the type of crystal material employed as well as the geometry of the crystal's growth face, the cross-sectional area of fiber 2 being about equal to the square of the wavelength ($\lambda^2$) of the signal being guided.

One method of producing elongated single crystal fibers employs a furnace for housing a crystal sample. The furnace is either evacuated or contains an inert gas. A controlled laser beam is focused to a fine point on the crystal sample to melt the crystal at that point only. The desired growth face of a seed crystal is brought into contact with the melt zone, and thereafter gradually withdrawn from the melt. As the seed is initially withdrawn, a portion of the melted crystal sample material adheres to the seed face, whereupon further withdrawal of the seed results in a single crystal fiber being formed having a face geometry or equivalent to that of the seed. The size or diameters of the crystal cross-section are determined by the seed pull rate and temperature of the melt zone. The uniformity of the crystal fiber cross-section is also determined by the uniformity of the pull and the temperature of the melt zone.

The single crystal fiber 2 of the fiber acoustic waveguide 1 is shown to have a near rectangular cross-section in FIG. 2. Although a rectangular cross-section is in close conformity to the cross-section of microwave waveguides, such a cross-section is given for illustrative purposes only, for many other single crystal fiber cross-sectional geometries are applicable for use in the fiber acoustic waveguide 1 of the present invention.

The fiber acoustic waveguide 1 includes an elongated single crystal fiber 2 having a single crystal layer 3 deposited on its outer surface (see FIG. 2). The single crystal layer 3 must have a higher velocity of propagation than the single crystal fiber 2, in order for the crystal layer 3 to function to guide acoustic energy into the crystal fiber 2. A suitable material for the single crystal fiber 2 is Yttrium-Iron-Garnet (YIG). A layer of Yttrium-Aluminum-Garnet (YAG) is epitaxially deposited on the outer surface of the YIG fiber 2, to form the single crystal fiber acoustic waveguide 1. Many other techniques are available for depositing crystal layers 3 on single crystal fibers 2.

Many crystal materials are applicable for use in the fiber acoustic waveguide 1 of the present invention. For example, Table 1 presents the acoustic propagation losses at 1300 MHZ for 500 microseconds delays for Yttrium-Iron-Garnet (YIG), Spinel ($MgOAl_2O_3$), Sapphire ($Al_2O_3$), Lithium tantalate ($LiTaO_3$), and Lithium Niobate ($LiNbO_3$). The 1,300 MHz frequence was selected as typical for a center frequency which allows a bandpass of 500 MHz.

| Material | Length* (Meters) | Losses (db) |
|---|---|---|
| YIG | 3.6 | 169 |
| $MgOAl_2O_3$ | 4.41 | 57 |
| $Al_2O_3$ | 5.57 | 169 |
| $LiTaO_3$ | 3.09 | 67 |
| $LiNbO_3$ | 3.28 | 101 |

*Length cut for 500 microseconds delay

The fiber acoustic waveguide 1 can be cut to different lengths to provide a desire delay or plurality of delays. The delay is equal to the velocity of propagation of the material of the single crystal fiber 2 times its length. Thus, the fiber acoustic waveguide 1 is ideally suited for use as an acoustic delay line, which is one form of data storage. The frequency response of the waveguide 1 is proportional to frequency of the acoustic wave squared. The total loss in the waveguide 1 is the db loss per unit length times the length.

A fiber acoustic waveguide system is shown in FIG. 1, and includes the fiber acoustic waveguide 1, a driver transducer 4, a pickup transducer 5, a compensation filter 7, and two amplifier 9, 11.

Figure 3:
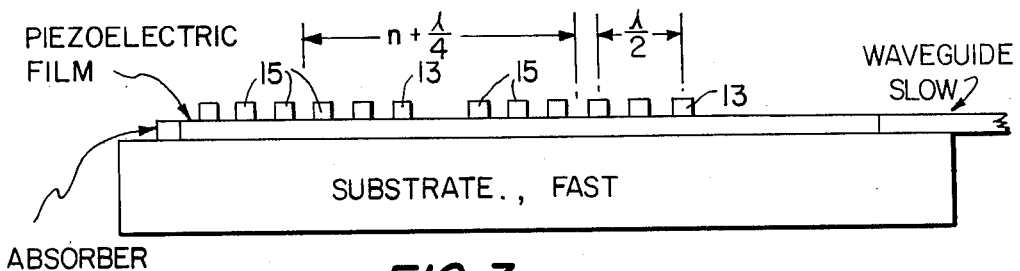
FIG. 3 is cross-section BB of an electroacoustical transducer.

The driver and pickup printed circuit transducers 4, 5 are identical in design, a cross-section of the transducers 4, 5 being shown in FIG. 3. Two sets of drive fingers 13 are provided with each transducer 4, 5. One set of drive fingers 13 per transducer 4, 5 would provide an operable transducer 4, 5, but two sets of drive fingers 13 are used to minimize the effect of reversal of any acoustic signals. An acoustic absorber 17 is also used to minimize the effect of reverse acoustic signals. The two sets of fingers 13 on each transducer 4, 5 are spaced in phase quadrature ($n + \lambda/4$), where $n$ is an integer (0,1,2,3 . . . ) and $\lambda$ is the wavelength of the acoustic signal, such spacing providing maximum reduction of reverse signals. The spacing between the interlaced fingers 15 is ¼ wavelengths, and between the fingers 15 which are electrically connected together into three fingered forks (as shown in FIG. 1) by printed circuit conductive paths is ½ wavelengths. Coupling losses will tend to compensate for the fiber waveguide 1 losses, when the finger spacing is set to the shortest wavelengths to be passed through the transducer.

Each of the transducers 4, 5 has its sets of drive fingers 13 interconnected by shunts 19. The outputs 21, 23 of amplifier 9 are each connected to an individual shunt 19 of drive transducer 4. The inputs 25,27 of amplifier 11 are each connected to an individual shunt 19 of pickup transducer 5.

The sets of conductive drive fingers 13 of each transducer 4,5 are deposited upon a substrate 29. A tapered piezoelectric film 31 is deposited on top of the sets of drive fingers 13 and substrate 29 of each one of the transducers 4,5.

The compensation filter 7 is connected between a signal input terminal 32 and an input amplifier 9. The output of amplifier 11 is connected to a signal output terminal 33.

The operation of the fiber acoustic waveguide system will now be explained. A signal, such as a microwave signal, is connected to input terminal 32 of the system. The signal is passed through the compensation filter 7, which serves to flatten the system frequency response over the desired band. The signal is amplified by drive amplifier 9, the gain of the amplifier being set to make up for system losses. The amplified signal is inputted to the drive transducer 4. In turn, the electrical fingers 13 of the drive transducer 4 couple the electrical signals into the piezoelectric film 31 which responds with corresponding mechanical stresses to produce acoustic analogs of the electrical signals. The tapered piezoelectric film 31, connected to one end of the fiber waveguide 1, guides the acoustic signal into the waveguide 1. The film 31 must have a slower velocity of acoustic propagation than does the substrate 29, in order to ensure that the acoustic signal propagates in the film 31 and not in the substrate 29.

The single crystal fiber acoustic waveguide 1 transports the acoustic signal to the other end of the waveguide 1, connected to the taper of the piezoelectric film 31 of the pickup transducer 5. The acoustic signal is transported with a delay equal to the length of the crystal fiber waveguide 1 times its acoustic velocity of propagation.

Mechanical stresses upon the piezoelectric film 31 of the transducer 5, caused by the received acoustic signal, are converted back into an electrical signal by the film 31 and coupled therefrom to the sets of electrical fingers 13 of transducer 5. Pickup transducer amplifier 11 serves as an output amplifier, to output the electrical signals from pickup transducer and to match the impedance of the transducer 5 to the next stage.

It should be noted that the fiber acoustic waveguide of the present invention may be used with many other types of electroacoustic transducers, in addition to the transducers 4, 5 illustrated in the fiber acoustic waveguide system of FIG. 1.

Also, the fiber acoustic waveguide 1 is shown formed into one loop. Looping of such fibers 2 minimizes the use of space, as the fibers are flexible and can be wound into many loops.

FIG. 4 shows the frequency response of the fiber acoustic waveguide 1; the compensation filter 7 plus transducers 4, 5; and of the fiber acoustic waveguide system, the response of the system being the summation of the other responses shown. The curves are based on the use of a spinel single crystal fiber waveguide 1. As shown, the system response is flat due to the negatively sloped response of the filter 7 plus transducers 4, 5 compensating for the positively sloped response of the waveguide.

Since fixed lengths of the fiber acoustic waveguide 1 produce fixed delays, the waveguide 1 is readily adapted for use as a delay line. For example, a plurality of different lengths of fiber acoustic waveguides 1 can be interconnected by computer controlled switches to provide a programmable delay line under computer control. The switches would be controlled to selectively interconnect any desired individual ones of the plurality of fiber acoustic waveguides 1 into a series delay line configuration. Each one of the plurality of waveguides would be included in a waveguide system similar to that of FIG. 1 and RF switches would be employed. If YIG fiber acoustic delay lines were employed, a 3.6 meter long fiber waveguide 1 would provide 500 microseconds of delay whereas a 7.031 millimeter long fiber waveguide 1 would provide 0.488 microseconds.

The fiber acoustic waveguide 1 may also have application in radar test systems, electronic countermeasure device, computer systems, communications systems, microwave processing systems, and so forth.

It should also be noted that an acousto-optic technique, based on Bragg defraction, can be used with the fiber waveguide 1 to provide a variable or controllable delay. The technique involves passing a laser beam through the fiber acoustic waveguide 1, wherein as the beam is moved along the fiber waveguide 1, the delay is correspondingly changed. This technique is applicable to radar to target range and doppler simulation equipment. The position of the laser probe along the waveguide 1 would give range delay, whereas the motion of the laser probe along the line would give doppler.

Although many applications of the fiber acoustic waveguide 1 and system have been illustrated, the present invention is not so limited, and can readily be extended for use in many other applications, as are obvious to one skilled in the field of the related art.

What is claimed is:

1. A fiber acoustic waveguide comprising: a single crystal fiber having a cross-sectional area substantially equal to the square of the wavelength of an acoustic signal to be coupled thereto, and an outer elongated surface, extending in the direction of acoustic wave propagation; and a single crystal film deposited on the outer elongated surface of said crystal fiber, wherein said single crystal film has a higher velocity of acoustic propagation than said single crystal fiber, said film being used to guide acoustic energy into said fiber.

2. The fiber acoustic waveguide of claim 1, wherein the material of said single crystal fiber is Yttrium-Iron-Garnet (YIG); and the material of said single crystal film is Yttrium-Aluminum-Garnet (YAG).

3. The fiber acoustic waveguide of claim 1, wherein the length of said waveguide is directly proportional to the delay in transporting an acoustic signal through said waveguide whereupon fixed lengths of said waveguide provide fixed delays.

4. The fiber acoustic waveguide of claim 1, wherein said single crystal film is epitaxially grown onto the outer surface of said single crystal fiber.

5. The fiber acoustic waveguide of claim 2, wherein said single crystal film of YAG material is epitaxially grown onto the outer surface of said single crystal fiber of YIG material.

6. A fiber acoustic waveguide comprising: a single crystal fiber having a cross-sectional area substantially equal to the square of the wavelength of an acoustic signal to be coupled thereto, and an outer elongated surface extending in the direction of acoustic wave propagation; and a single crystal film epitaxially grown on the outer elongated surface of said single crystal fiber, said film having a higher velocity of propagation than said fiber, said film being used to guide acoustic energy into said fiber.

7. The fiber acoustic waveguide of claim 6, wherein said single crystal fiber is of a YIG material, and said single crystal film is of a YAG material.

8. The fiber acoustic waveguide of claim 7, wherein the length of said wave guide is directly proportional to the delay in transporting an acoustic signal through said waveguide whereupon fixed lengths of said waveguide provide fixed delays.

9. A fiber acoustic waveguide system comprising: a single crystal fiber acoustic waveguide; transducer drive means for receiving and converting an electrical signal into an acoustic signal, and for driving acoustic signals into one end of said fiber acoustic waveguide; transducer pickup means for receiving the acoustic signal from the other end of said fiber acoustic waveguide, for converting the acoustic signal into an electrical signal; and said fiber acoustic waveguide including: a single crystal fiber having a cross-sectional area substantially equal to the square of the wavelength of an acoustic signal to be coupled thereto, and an elongated outer surface extending in the direction of acoustic wave propagation; and a single crystal film deposited on the outer elongated surface of said single crystal fiber, wherein said single crystal film has a higher velocity of acoustic propagation than said single crystal fiber, said film being used to guide acoustic energy into said fiber.

10. The fiber acoustic waveguide system of claim 9, wherein the material of said single crystal fiber is Yttrium-Iron-Garnet; and the material of said single crystal film is Yttrium-Aluminum-Garnet.

11. The fiber acoustic waveguide system of claim 9, wherein said single crystal film is epitaxially grown onto the outer surface of said single crystal fiber.

12. The fiber acoustic waveguide system of claim 10, wherein said single crystal film of YAG material is epitaxially grown onto the outer surface of said single crystal fiber of YIG material.

13. The fiber acoustic waveguide system of claim 9, wherein said transducer drive means includes: a compensation filter for receiving an electrical input signal, a first amplifier having an input connected to an output of said compensation filter, said amplifier being used to preamplify the electrical input signal, the gain of said amplifier being directly proportional to system losses; a first transducer having an input connected to an output of said amplifier, said transducer serving to convert the electrical signal outputted from said amplifier to an acoustic signal, to couple said acoustic signal into one end of said fiber acoustic waveguide, and has a frequency response, which is combination with the frequency response of said waveguide, compensation filter, amplifier, and transducer pickup means, provides a flat frequency response for said system.

14. The fiber acoustic waveguide system of claim 9, wherein said transducer pickup means includes: a second transducer having an input connected to the other end of said fiber acoustic waveguide, and an output; and a second amplifier having an input connected to the output of said second transducer; said second transducer serving to convert acoustic signals, received from said fiber acoustic waveguide, into electrical signals; said second amplifier serving as an output amplifier and an impedance for coupling the output of said second transducer to a next stage.

15. The fiber acoustic waveguide system of claim 9, wherein said fiber acoustic waveguide is cut to a fixed length to provide a desired delay in the guiding of an acoustic signal between said transducer drive means and said transducer pickup means, the length of said waveguide being directly proportional to the delay.

16. A fiber acoustic delay line comprising: a single crystal fiber having a cross-sectional area substantial equal to the square of the wavelength of an acoustic signal, and an outer elongated surface extended in the direction of acoustic wave propagation; and a single crystal film deposited on the outer elongated surface of said single crystal fiber, wherein the velocity of acoustic propagation of said single crystal film is higher than that of siad single crystal fiber, said film guiding acoustic energy into said fiber; the delay of said fiber acoustic delay line being equal to the velocity of acoustic propagation of said single crystal fiber times the length of said fiber.

17. The fiber acoustic delay line of claim 16, wherein the material of said single crystal fiber is Yttrium-Iron-Garnet (YIG); and the material of said single crystal film is Yttrium-Aluminum-Garnet (YAG).

18. The fiber acoustic delay line of claim 16, wherein said single crystal film is epitaxially grown onto the outer elongated surface of said single crystal fiber.

19. The fiber acoustic delay line of claim 17, wherein said single crystal film of YAG material is epitaxially grown onto the outer elongated surface of said single crystal fiber of YIG material.

20. A fiber acoustic delay line comprising: a single crystal fiber having a cross sectional area substantially equal to the square of the wavelength of an acoustic signal, and an elongated surface extending in the direction of acoustic wave propagation; and a single crystal film epitaxially grown onto the outer elongated surface of said single crystal fiber, said film having a higher velocity of acoustic propagation than said fiber; the delay of said fiber acoustic delay line being equal to the velocity of acoustic propagation of said single crystal fiber times the length of said fiber.

21. The fiber acoustic delay line of claim 20, wherein the material of said single crystal fiber is Yttrium-Iron-Garnet; and the material of said single crystal film is Yttrium-Aluminum-Garnet.

22. A method for fabricating a fiber acoustic waveguide, comprising the steps of: forming an elongated single crystal fiber extending in the direction of acoustic wave propagation, and having a cross-sectional area substantially equal to the square of the wavelength of an acoustic signal to be guided; and depositing a single crystal film upon the outer surface of the single crystal fiber, for guiding the acoustic signal into the fiber, said film having a higher velocity of acoustic propagation than said fiber.

* * * * *